United States Patent
Nistler et al.

(10) Patent No.: US 9,989,617 B2
(45) Date of Patent: Jun. 5, 2018

(54) B1 FIELD-BASED REGULATION WITHIN A SEQUENCE FOR NMR

(71) Applicants: Jürgen Nistler, Erlangen (DE); David Andrew Porter, Poxdorf (DE); Thorsten Speckner, Erlangen (DE); Christian Wünsch, Röthenbach a.d.Pegnitz (DE)

(72) Inventors: Jürgen Nistler, Erlangen (DE); David Andrew Porter, Poxdorf (DE); Thorsten Speckner, Erlangen (DE); Christian Wünsch, Röthenbach a.d.Pegnitz (DE)

(73) Assignee: Siemens Aktiengesellschaft, München (DE)

( * ) Notice: Subject to any disclaimer, the term of this patent is extended or adjusted under 35 U.S.C. 154(b) by 1500 days.

(21) Appl. No.: 13/781,199

(22) Filed: Feb. 28, 2013

(65) Prior Publication Data
US 2013/0221965 A1 Aug. 29, 2013

(30) Foreign Application Priority Data
Feb. 29, 2012 (DE) ........................ 10 2012 203 111

(51) Int. Cl.
*G01R 33/58* (2006.01)
*G01R 33/565* (2006.01)
*G01R 33/36* (2006.01)

(52) U.S. Cl.
CPC ....... *G01R 33/586* (2013.01); *G01R 33/5659* (2013.01); *G01R 33/36* (2013.01)

(58) Field of Classification Search
CPC ............. G01R 33/5659; G01R 33/583; G01R 33/586; G01R 33/36; G01R 33/3607
USPC .................................................. 324/307, 309
See application file for complete search history.

(56) References Cited

U.S. PATENT DOCUMENTS

| 5,138,261 A * | 8/1992 | Ratzel ................. G01R 33/343 324/318 |
| 5,559,853 A | 9/1996 | Linders et al. |
| 6,294,913 B1 | 9/2001 | Hinks et al. |
| 6,927,573 B2 * | 8/2005 | Eberler ................. G01R 33/36 324/309 |
| 6,943,551 B2 | 9/2005 | Eberler et al. |
| 7,064,546 B2 | 6/2006 | Feiweier |
| 7,573,266 B2 | 8/2009 | Feiweier et al. |
| 8,198,891 B2 | 6/2012 | Sacolick et al. |
| 2004/0150401 A1 * | 8/2004 | Eberler ................. G01R 33/36 324/318 |

(Continued)

FOREIGN PATENT DOCUMENTS

| DE | 10057628 A1 | 6/2001 |
| DE | 10354941 A1 | 6/2004 |
| DE | 10314215 B4 | 10/2004 |

(Continued)

OTHER PUBLICATIONS

German Office Action dated Jan. 28, 2013 for corresponding German Patent Application No. DE 10 2012 203 111.1 with English translation.

*Primary Examiner* — Rishi Patel
(74) *Attorney, Agent, or Firm* — Lempia Summerfield Katz LLC

(57) ABSTRACT

A B1 magnetic field may be regulated during a magnetic resonance tomography (MRT) imaging sequence.

11 Claims, 4 Drawing Sheets

(56) References Cited

U.S. PATENT DOCUMENTS

2007/0145975 A1* 6/2007 Feiweier .............. G01R 33/583
                                                                  324/307
2007/0170917 A1    7/2007 Thompson et al.

FOREIGN PATENT DOCUMENTS

DE    102005061567 B3    8/2007
DE    102010017315 A1   12/2010

* cited by examiner

B1 FIELD-BASED REGULATION WITHIN A SEQUENCE FOR NMR

This application claims the priority benefit of German Patent Application DE 10 2012 203 111.1, filed Feb. 29, 2012, which is hereby incorporated herein in its entirety.

BACKGROUND

The present embodiments relate to methods and systems for MRT imaging.

Magnetic resonance tomographs (MRTs) for examination of objects or patients using magnetic resonance tomography (NMR, MRI) are known, for example, from DE10314215B4.

BRIEF SUMMARY

The present embodiments may obviate one or more of the drawbacks or limitations in the related art. For example, MRT imaging may be optimized.

DETAILED DESCRIPTION OF THE DRAWINGS

Figure 4:
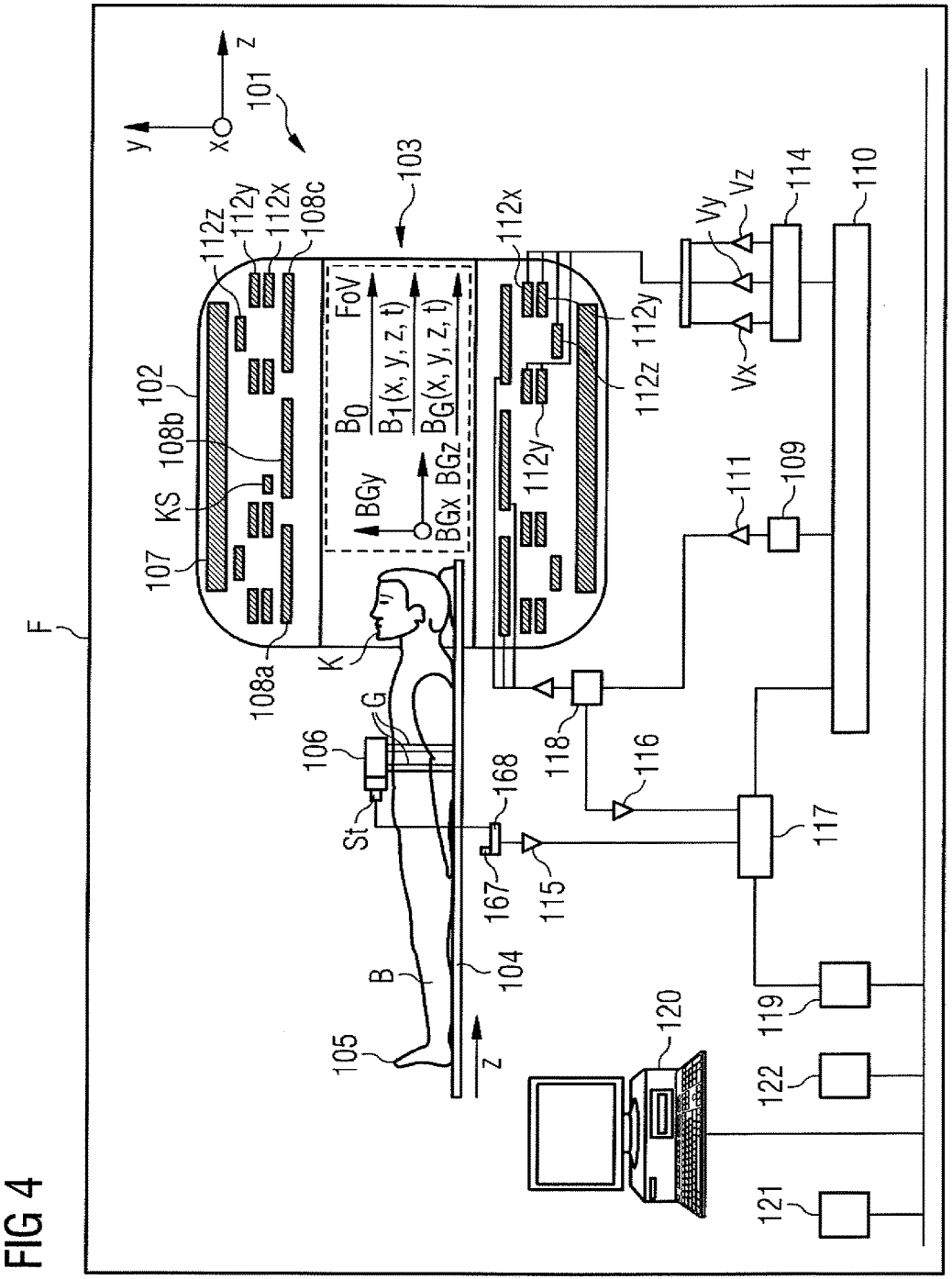
FIG. 4 shows one embodiment of an MRT system.

FIG. 4 shows an imaging magnetic resonance tomography (MRT) device 101 (e.g., located in a screened room or Faraday cage F) having a whole body coil 102. The whole body coil 102 has a tubular space 103 into which a patient couch 104 with a body of, for example, an object under examination (e.g. a patient) 105, with or without local coil arrangement 106, may be moved in the direction of the arrow z to generate images of the patient 105 using an imaging method. Disposed on the patient is a local coil arrangement 106, which may be used to generate images of a partial area or region of the body 105 in a local area (also referred to as field of view or FOV) of the MRT. Signals of the local coil arrangement 106 may be evaluated (e.g., converted into images, stored, or displayed) by an evaluation device (e.g., the evaluation device 168, 115, 117, 119, 120, or 121) of the MRT device 101, which may be connected to the local coil arrangement 106 via, for example, a coaxial cable or via a wireless connection 167.

In order to examine a body 105 (e.g., an object under examination or a patient) with magnetic resonance imaging using the MRT device 101, different magnetic fields, which are tuned to one another as precisely as possible with respect to their temporal and spatial characteristic, are radiated onto the body 105. A strong magnet (e.g., a cryomagnet 107) in a measurement cabin having, for example, tunnel-shaped opening 103, generates a strong static main magnetic field $B_0$ (e.g., measuring 0.2 to 3 Tesla or more than 3 Tesla). The body to be examined 105 supported on a patient couch 104 is moved into an approximately homogeneous area of the main magnetic field $B_0$ in the field of view FoV. The nuclear resonance of atomic nuclei of the body 105 is excited by magnetic high-frequency excitation pulses $B1(x, y, z, t)$ radiated into the nuclei via a high-frequency antenna (and/or a local coil arrangement), which is shown here in simplified form as a body coil 108 (e.g., with parts 108a, 108b, 108c). High-frequency excitation pulses are generated by, for example, a pulse generation unit 109 controlled by a pulse sequence control unit 110. After the high-frequency pulses are amplified by one or more high-frequency amplifiers 111, the pulses are conveyed to the high-frequency antenna. The high-frequency system shown in FIG. 4 is exemplary. In other embodiments, more than one pulse generation unit 109, more than one high-frequency amplifier 108, a number of high-frequency antennas 108a, 108b, and/or 108c, or combinations thereof, may be used in the MRT device 101.

The MRT device 101 further includes gradient coils 112x, 112y, 112z, with which magnetic gradient fields $B_G(x, y, z, t)$ are radiated during a measurement for selective slice excitation and for local encoding of the measurement signal. The gradient coils 112x, 112y, 112z are controlled by a gradient coil control unit 114, which, like the pulse generation unit 109, is connected to the pulse sequence control unit 110.

The signals emitted by the excited nuclear spins of the atomic nuclei in the object under examination are received by the body coil 108 and/or at least one local coil arrangement 106, amplified by assigned high-frequency amplifiers 116 and further processed and digitized by a receive unit 117. The recorded measurement data is digitized and stored as complex numerical values in a k-space matrix. A corresponding MR image may be reconstructed from the k-space matrix containing the complex numerical values by, for example, a multi-dimensional Fourier transformation.

For a coil that may be operated in both the transmit mode and the receive mode, such as, for example, the body coil 108 or a local coil 106, correct signal forwarding is regulated by a transceiver switch 118 connected upstream.

An image processing unit 119 generates an image from the measurement data. The image is presented to a user via an operator console 120 and/or is stored in a memory unit 121. A central processing unit 122 controls the individual components of the system.

In MRT, images with a high signal-to-noise ratio (SNR) are generally recorded with local coil arrangements (coils or local coils). Local coil arrangements are antenna systems that are attached in the immediate vicinity on (e.g., anteriorly), below (e.g., posteriorly), or in the body 105. During an magnetic resonance (MR) measurement, the excited nuclei induce a voltage in the individual antennas of the local coil, which is then amplified with a low-noise preamplifier (e.g. LNA, Preamp) and is forwarded to the receive electronics. To improve the signal-to-noise ratio, even for high-resolution images, high-field systems (e.g., 1.5-12 Tesla or more) are also used. If a number of individual antennas that may be connected to an MR receive system exceeds a number of available receivers, a switching matrix (also referred to as an RCCS) is inserted between the receive antennas and receivers. The switch matrix will route the currently active receive channels (generally those which currently lie in the field of view of the magnet) to the available receivers. As such, more coil elements may be connected than there are receivers available, since, with respect to whole body coverage, only the coils that are located in the FoV (Field of View) or in the homogeneity volume of the magnet have to be read out.

The local coil arrangement 106 is, for example, an antenna system that may, for example, include one or more antenna elements (e.g., coil elements). The antenna elements may be or include, for example, loop antennas (loops), a butterfly, flex coils or saddle coils. A local coil arrangement typically includes, for example, coil elements, a preamplifier, other electronics (e.g., sheath current filters, etc.), a housing, support, and, in some embodiments, a cable with plug that connects the local coil arrangement to the MRT system. A receiver 168 attached to the system side filters and digitizes a signal received (e.g., wirelessly) from a local coil 106 and transfers the data to a digital signal processing device. From the data obtained by a measurement, the digital signal processing device derives an image or a spectrum and makes the image or spectrum available to the user for, for example, diagnostic reasons (e.g., diagnosis) and/or storing.

Figure 1:
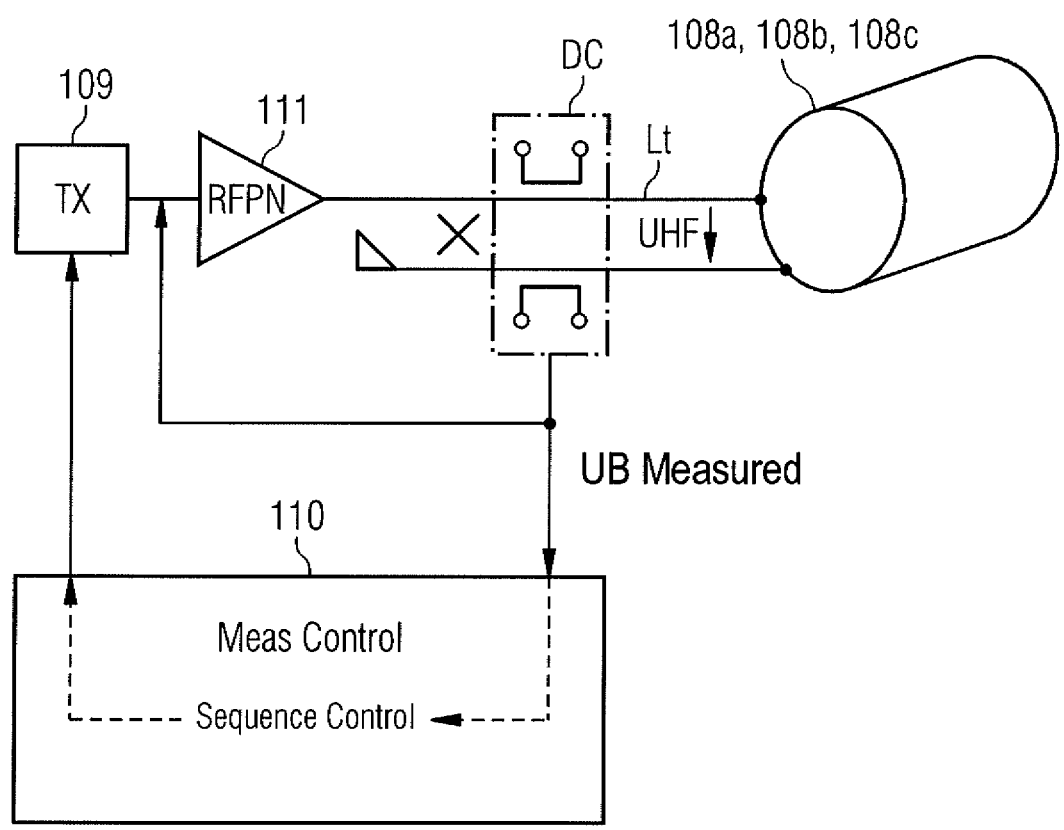
FIG. 1 shows one embodiment of a system for regulating a B1 magnetic field.
Figure 2:
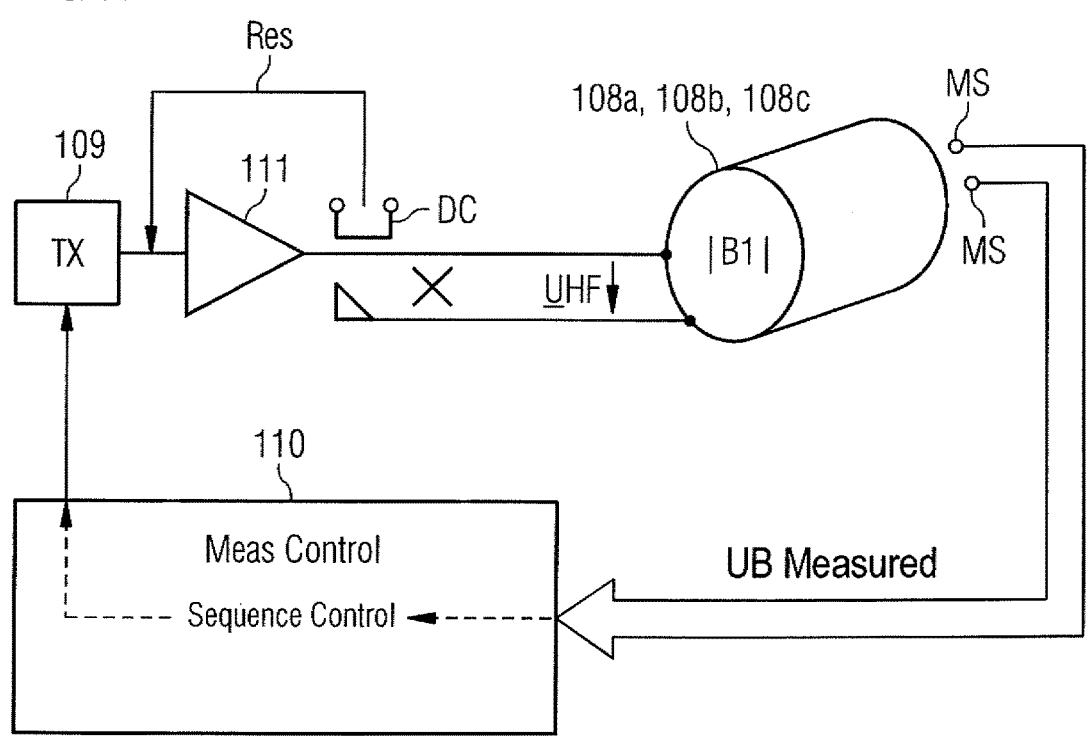
FIG. 2 shows another embodiment of a system for regulating a B1 magnetic field.
Figure 3:
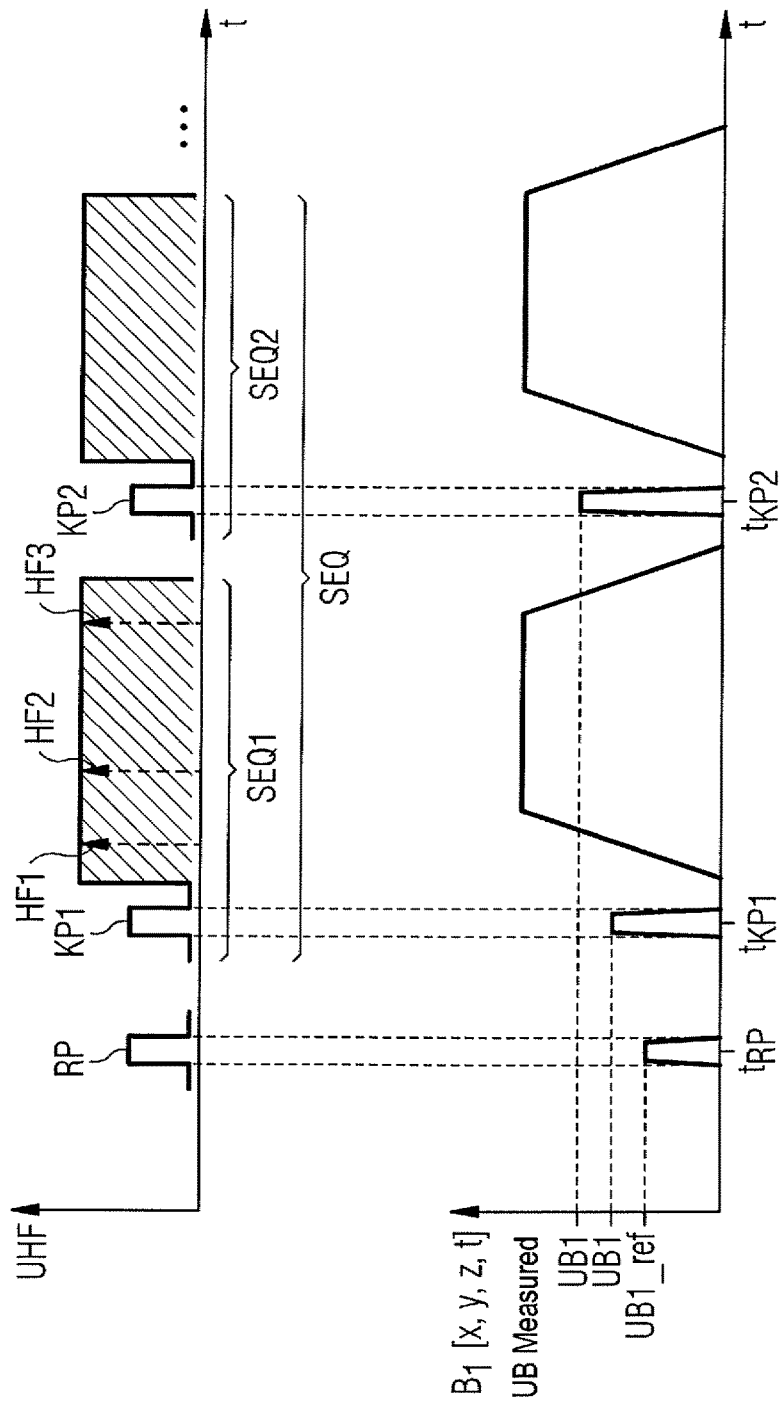
FIG. 3 shows a diagram of an example timing curve of an MRT imaging sequence with a reference pulse and calibration pulses.

FIGS. 1-3 illustrate various embodiments.

For applications of MRT imaging such as, for example, FMRI (functional MRI) or DTI (diffusion tensor imaging), stability of the system is important. Instabilities, such as those caused by timing drift, may occur. These applications may also demand a very high loading of an MRT system and its components. In such cases, the system may heat up, which may have wide-ranging influence on the system. For example, 1) the HF transmitter may heat up, such that the amplification may change and, in turn, a change in the flip angle during transmission may occur, thereby changing the signal in the MRT image; and 2) a gradient coil may heat up, producing an associated mechanical expansion and thereby a feedback effect on the HF transmit antenna, which a) may express itself via a change in the reflection factors and coupling (by which the load reflection factor for the HF amplifier may change, which may again produce a change in amplification), and b) may have an effect on the polarization of the transmit field, through which, even with the same transmit power, the MR-effective part of the B1 field may be reduced and, in turn, a change of the flip angle during transmission may occur, thereby changing the signal in the MRT image.

An internally contemplated approach of a temperature stabilization may only be effective to a partial extent because of performance restrictions of the system.

With respect to a further internally contemplated approach of amplifier regulation, regulations for the HF amplifier may be at least internally known, both for the previous performance and for variables that are proportional to the B1 field. The performance regulation may not, however, compensate for all effects. Moreover, a B1 regulation may demand complex calibration measurements and would still have to be integrated into an existing system concept.

In one embodiment, a B1 magnetic field regulation (e.g., DC, MS, 110, 109) may be carried out at times t within a sequence SEQ (or MRT sequence or MRT excitation sequence). The sequence may, for example, include sequence segments SEQ1 and SEQ2 (see FIG. 3), and have a voltage (e.g., voltage=UHF) and/or current measurement and/or directional couplers DC between an amplifier RFPN (e.g., for an HF pulse to be transmitted, defined by a transmit device 109, 110, 118) and at least one (HF–) coil 108a, 108b, 108c (see FIG. 1). The sequence may be measured by the B1 field values (as measures or voltages) with at least one magnetic field probe MS and used for calibration of temporally consecutive HF pulses (see FIG. 2).

In one embodiment of a B1 magnetic field regulation, at the beginning or directly before the beginning of the actual measurement, a reference pulse RP is sent and, at a later time, one or more calibration pulses KP1, KP2; HF1 are sent.

In one embodiment, a square wave pulse may be used as the reference pulse RP and/or calibration pulse(s) KP1, KP2.

While an HF pulse HF is sent out with, for example, the aid of magnetic field and/or pickup probes MS (e.g. in the bodycoil and/or in the FoV and/or on a local coil), as shown in FIG. 2, and/or with one or more other measurement devices (e.g. directional couplers DC as shown in FIG. 1 and/or FIG. 2), voltage values representing the strength of the B1 field (see the vertical axis of FIG. 3) may be measured. The voltage values are related to the currently generated B1 field. For example, measured value UB1, at point in time tKP1, represents the field |B1| at this point in time at the measurement point).

The reference pulse RP and the one or more calibration pulse(s) KP1, KP2 are, for example, applied (transmitted) with the same voltage UHF. From the reference pulse RP, the reference variable ("UB1_Ref") is determined by measuring the voltage at point in time tRP for the later regulation (e.g., regulation 110; 109; Reg) of the voltage (e.g., UHF) of consecutive HF pulses over time (e.g., shown in FIG. 3 in simplified form as HF pulses HF1, HF2, HF3 etc.)

The ratio (UB1_ref/UB1) of the measured strength (UB1_ref) of the B1 field at time tRP of the reference pulse RP to the measured strength (UB1) of the B1 field at the time of the calibration pulse KP1 may be considered (as regulation) by a controller (e.g., controller 109 and/or 110). In the embodiment in which there are consecutive HF pulses HF1, HF2, HF3, the target values (determined in the usual way) of the voltages UHF for HF pulses HF1, HF2, HF3 may be multiplied, respectively, with the ratio (UB1_ref/UB1 or UB1/UB1_ ref), and the HF pulses HF1, HF2, HF3 may be transmitted with, for example, voltages corresponding to the ratio of multiplied target values.

During the course of an MRT imaging sequence (e.g., the SEQ comprising SEQ1, SEQ2 etc.), at one or, as in FIG. 3, at a number of suitable points in time tKP1, tKP2, one or, as in FIG. 3, a number of calibration pulses KP1, KP2, are transmitted. A calibration pulse variable, a B1 value ("UB1") at point in time tKP1, and, in some cases, a further new value "UB1" at point in time tKP2 are determined during the calibration pulse KP1 and/or KP2 (e.g. with MS, DC, 110).

All respective HF pulses HF1, HF2, HF3 following a calibration pulse KP1 (and, for example, before the next calibration pulse KP2, when this pulse is also transmitted) are now, for example, scaled so that, for example, the desired flip angle is obtained (FlipWinkel=FlipWinkel_Soll*UB1_Ref/UB1) and/or the desired B1 value is actually achieved (B1(HF1–Puls)=B1(HF1–Puls_Soll)*UB1_Ref/UB1) or B1 (HF1–Puls_Soll)* UB1/UB1_Ref).

The actual voltage UHF provided (see FIG. 3), with which an HF pulse HF1, HF2, or HF3 is to be generated, may thus be multiplied by a calibration factor UB1_Ref/ UB1 produced from the ratio of the measured voltage/ magnetic field value UB1 at the time of the last calibration pulse KP1 (or KP2) before the HF pulse HF1, HF2, HF3 to the measured B1 magnetic field value at the height of UB1_Ref at time tRP (see FIG. 3) of the reference pulse RP.

Since a correction pulse KP1, KP2 may influence the spin system, sequence timing and the characteristics of the correction pulse KP1, KP2 are selected so that the effect will be minimized. This may be done by, for example, minimizing the pulse number, minimizing the pulse amplitude, or simultaneously switching a gradient pulse in order not to "hit" the spin in the FOV.

In some embodiments, instead of utilizing the additional calibration pulses KP1 and/or KP2, the HF pulses HF1, HF2, HF3, etc. present may be used as calibration pulses KP1 and/or KP2 in the sequence. This may provide the advantage that frequency dependencies, for example through slice displacements, are detected as well and may also be corrected.

This enables a B1 regulation to be implemented for which the time constant can practically be set to any given value and thus may be adapted to the thermal time constants of the MRT system in an optimal manner.

Each sequence/application may decide whether or with what precision the regulation is necessary.

The present embodiments may be particularly advantageous when combined with a regulation for the forward power or transmit power of the HF transmitter (e.g., 118, Vx,Vy,Vz,112x,112y,112z) of the MRT 101 realized in hardware 110 and/or 118. The regulation variables may, in this embodiment, be generated from the same measured values. While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A system comprising:
   a magnetic resonance tomography (MRT) system configured to regulate a B1 magnetic field during an imaging sequence;
   a measuring device configured to:
      measure a reference variable during a reference pulse transmitted before one or more calibration pulses transmitted before or during at least one sequence segment of the imaging sequence, the reference variable representing at least an amount of a B1 magnetic field caused by the reference pulse, and
      measure a calibration pulse variable during the one or more calibration pulses, the calibration pulse variable representing at least an amount of a B1 magnetic field caused by the one or more calibration pulses; and
   a controller configured to regulate a voltage, a flip angle, or the voltage and the flip angle of high-frequency (HF) pulses of the imaging sequence following the calibration pulse using a ratio of the reference variable to the calibration pulse variable measured during the one or more calibration pulses.

2. The system as claimed in claim 1, wherein the MRT system comprises one or more magnetic field probes configured to measure the reference variable representing at least the amount of the B1 magnetic field caused by the reference pulse, the calibration pulse variable representing at least the amount of the B1 magnetic field caused by the one or more calibration pulses, or the reference variable representing at least the amount of the B1 magnetic field caused by the reference pulse and the calibration pulse variable representing at least the amount of the B1 magnetic field caused by the one or more calibration pulses.

3. The system as claimed in claim 2, wherein the one or more magnetic field probes comprise a plurality of pickup probes.

4. The system as claimed in claim 2, wherein the MRT system comprises one or more voltage, current, or voltage and current measurement devices connected between a high-frequency (HF) transmit device and an HF transmit antenna, the one or more voltage, current, or voltage and current measurement devices configured to measure the reference variable representing at least the amount of the B1 magnetic field caused by the reference pulse, the calibration pulse variable representing at least the amount of the B1 magnetic field caused by the one or more calibration pulses, or the reference variable representing at least the amount of the B1 magnetic field caused by the reference pulse and the calibration pulse variable representing at least the amount of the B1 magnetic field caused by the one or more calibration pulses.

5. The system as claimed in claim 1, wherein the measuring device comprises at least one direction coupler.

6. The system as claimed in claim 1, wherein the MRT system is configured to measure at least one voltage value as the calibration pulse variable and is configured to measure at least one voltage value as the reference variable.

7. A method for magnetic resonance tomography (MRT) imaging, the method comprising:
   regulating a B1 magnetic field within an imaging sequence;
   measuring a reference variable during a reference pulse transmitted before one or more calibration pulses transmitted before or during at least one sequence segment of the imaging sequence, the reference variable representing at least an amount of a B1 magnetic field caused by the reference pulse;
   measuring a calibration pulse variable during the transmission of the one or more calibration pulses, the calibration pulse variable representing at least an amount of a B1 magnetic field caused by the one or more calibration pulses; and
   determining a ratio of the reference variable to the calibration pulse variable measured during the one or more calibration pulses,
   wherein regulating the B1 magnetic field comprises generating high-frequency (HF) pulses of the imaging sequence, based on the determined ratio, following the transmission of the one or more calibration pulses.

8. The method as claimed in claim 7, wherein regulating the B1 magnetic field further comprises measuring, via one or more magnetic field probes, the reference variable representing at least the amount of the B1 magnetic field caused by the reference pulse or the calibration pulse variable representing at least the amount of the B1 magnetic field caused by the one or more calibration pulses.

9. The method as claimed in claim 8, wherein measuring the reference variable representing at least the amount of the B1 magnetic field caused by the reference pulse or the calibration pulse variable representing at least the amount of the B1 magnetic field caused by the one or more calibration pulses comprises measuring via a plurality of pickup probes.

10. The method as claimed in claim 7, wherein regulating the B1 magnetic field further comprises measuring, via one or more voltage, current, or voltage and current measurement devices, the reference variable representing at least the amount of the B1 magnetic field caused by the reference pulse, the calibration pulse variable representing at least the amount of the B1 magnetic field caused by the one or more calibration pulses, or the reference variable representing at least the amount of the B1 magnetic field caused by the reference pulse and the calibration variable variable representing at least the amount of the B1 magnetic field caused by the one or more calibration pulses, the one or more voltage, current, or voltage and current measurement devices being connected between a high-frequency (HF) transmit device and a HF transmit antenna.

11. The method as claimed in claim 7, wherein regulating the B1 magnetic field comprises:
   measuring at least one voltage value as the calibration pulse variable; and
   measuring at least one voltage value as the reference variable.

* * * * *